(12) United States Patent
Stamp et al.

(10) Patent No.: US 7,077,388 B2
(45) Date of Patent: Jul. 18, 2006

(54) BUBBLER FOR SUBSTRATE PROCESSING

(75) Inventors: Michael R. Stamp, Chandler, AZ (US); Frederick J. AmRhein, Fountain Hills, AZ (US); Arnold J. Dale, Mesa, AZ (US); Joseph C. Pottebaum, Chandler, AZ (US); Brian J. Ebert, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 213 days.

(21) Appl. No.: 10/622,127

(22) Filed: Jul. 17, 2003

(65) Prior Publication Data

US 2004/0084149 A1    May 6, 2004

Related U.S. Application Data

(60) Provisional application No. 60/398,073, filed on Jul. 23, 2002, provisional application No. 60/397,806, filed on Jul. 19, 2002.

(51) Int. Cl.
    *B01F 3/04*    (2006.01)
(52) U.S. Cl. ............ 261/121.1; 261/135; 261/DIG. 65; 118/726
(58) Field of Classification Search ............... 261/127, 261/135, 139, 121.1, 122.1, 124, DIG. 65; 118/726
See application file for complete search history.

(56) References Cited

U.S. PATENT DOCUMENTS

| | | | |
|---|---|---|---|
| 2,968,474 A | * | 1/1961 | Eichelman et al. ............ 261/46 |
| 3,473,216 A | * | 10/1969 | Huschke, Jr. et al. ....... 228/208 |
| 4,072,613 A | * | 2/1978 | Alig .......................... 210/198.1 |
| 4,281,235 A | * | 7/1981 | Peloquin ................. 219/121.14 |
| 4,436,674 A | | 3/1984 | McMenamin |
| 4,676,404 A | | 6/1987 | Yamazaki et al. |
| 4,859,375 A | | 8/1989 | Lipisko et al. |
| 4,979,545 A | | 12/1990 | Fair |
| 4,979,643 A | | 12/1990 | Lipisko et al. |
| 5,038,840 A | | 8/1991 | Fair |
| 5,069,244 A | | 12/1991 | Miyazaki et al. |

(Continued)

OTHER PUBLICATIONS

International Search Report for Application No. PCT/US03/22392 (the PCT counterpart of the parent application).

*Primary Examiner*—Scott Bushey
(74) *Attorney, Agent, or Firm*—Knobbe, Martens, Olson & Bear, LLP.

(57) ABSTRACT

A vaporization chamber for a substrate processing system includes a main body, a cover member and a transition member. The main body is made of aluminum and defines a first inner surface, which defines, at least in part, a cavity. The cover member is also made of aluminum. The cover member defines a second inner surface, which also defines, at least in part, the cavity. The cover member includes a carrier gas cover inlet, a liquid source cover inlet, a source cover outlet which extends from a first outer surface through the cover member to the second inner surface. The transition member is made of stainless steel and has a transition outer surface and a transition inner surface. The transition inner surface is aluminum cladded. The cover member includes a carrier gas cover inlet, a liquid source cover inlet, a source cover outlet which extend from a first outer surface through the cover member to second inner surface. The transition inner surface and the cover outer surface are welded together.

14 Claims, 13 Drawing Sheets

U.S. PATENT DOCUMENTS

| | | |
|---|---|---|
| 5,078,922 A | 1/1992 | Collins et al. |
| 5,148,945 A | 9/1992 | Geatz |
| 5,268,045 A | 12/1993 | Clare |
| 5,711,354 A | 1/1998 | Siegele et al. |
| 5,834,371 A * | 11/1998 | Ameen et al. .............. 438/656 |
| 6,038,919 A | 3/2000 | Schmitt et al. |
| 6,074,487 A | 6/2000 | Yoshioka et al. |
| 6,110,283 A | 8/2000 | Yamamuka et al. |
| 6,165,271 A | 12/2000 | Zhao et al. |
| 6,264,064 B1 | 7/2001 | Birtcher et al. |
| 6,544,669 B1 * | 4/2003 | Groll .......................... 428/687 |
| 6,561,498 B1 * | 5/2003 | Tompkins et al. ............ 261/77 |
| 2002/0014275 A1 | 2/2002 | Blatt et al. |
| 2002/0017534 A1 | 2/2002 | Soberunie et al. |

* cited by examiner

BUBBLER FOR SUBSTRATE PROCESSING

PRIORITY INFORMATION

This application claims the priority benefit under 35 U.S.C. § 119(e) of Provisional Application 60/398,073 filed Jul. 23, 2002 and Provisional Application 60/397,806 filed Jul. 19, 2002.

BACKGROUND OF THE INVENTION

1. Field of the Invention

This invention relates generally to the deposition of silicon-containing films, and more particularly to the use of trisilane, Si3H8, in chemical vapor deposition processes for the deposition of thin silicon-containing films on various substrates.

2. Description of the Related Art

Silane ($SiH_4$) is widely used in the semiconductor manufacturing industry to deposit silicon-containing ("Si-containing") films by chemical vapor deposition (CVD). However, the deposition of very thin (e.g., about 150 Å or less) silicon-containing films using silane is very challenging, particularly over large area substrates. Very thin Si-containing films deposited using silane are often not continuous, due to island-like film nucleation processes, or have very rough surfaces due to the coalescence of island-like nuclei. In addition, the elemental composition of doped thin films is often not homogeneous in the cross-film and/or through-film directions because of differences in relative incorporation rates of the dopant elements. The resulting films do not exhibit uniform elemental concentrations and, therefore, do not exhibit uniform film physical properties across the surface and/or through the thickness of the film.

Deposition of such thin films with uniform elemental concentrations represents a serious challenge for deposition processes that rely on silane as the silicon source precursor. Typical furnace-based deposition processes that utilize silane are generally unable to deposit continuous, smooth and homogeneous films having a thickness of 100 Å or less. Plasma-enhanced CVD processes typically have serious limitations for the deposition of homogeneous, continuous thin films with thicknesses below about 200 Å. U.S. Pat. No. 5,648,293 states that, for an amorphous silicon layer over a transistor gate insulator, when the film thickness is less than approximately 15 nanometers (150 Å), both decrease of the electron mobility and increase of the transistor threshold voltage appear. Similarly, typical single wafer thermal CVD processes also suffer from an inability to deposit smooth, homogeneous thin film materials with a thickness of 150 Å or less.

Attempts to produce thin Si-containing films and incorporate them into devices have not been entirely satisfactory. For example, U.S. Pat. No. 6,194,237 discloses depositing a conductive layer of $Si_{0.7}Ge_{0.3}$ on $SiO_2$, depositing another layer of $SiO_2$ over the conductive layer, and then annealing so that the conductive layer forms quantum dots. The conductive layer is stated to have a thickness of 30 Å, but the wide variation in size and distribution for the resulting quantum dots indicates that the conductive layer was not deposited uniformly. Attempts to provide quantum dots of more uniform size and distribution have been disclosed, but typically involve high temperatures and/or more complicated deposition schemes, see e.g. U.S. Pat. No. 6,235,618.

Japanese Patent Application Disclosure No. H3-187215 discloses the use of pure disilane (free of silane and trisilane) in a thermal CVD device to deposit a film having a thickness of 180 Å; see also Japanese Publication No. 03187215 A. U.S. Pat. No. 5,789,030 discloses a low pressure CVD ("LPCVD") method for depositing an in-situ doped silicon thin film that involves first depositing a very thin layer of silicon before introducing a dopant gas species to form the doped film. While the initial undoped layer is stated to be only several monolayers thick, the overall thickness of the layer is 500 Å to 2,000 Å, including the in situ doped portion.

The use of higher silanes such as disilane and trisilane is sometimes mentioned in the art as an alternative to the use of silane, but in most cases the only data reported concern the use of silane. Disilane ($Si_2H_6$) is known to be less stable than silane, and in deposition experiments employing disilane it was reported that disilane gives poor step coverage and that the deposition reaction is too violent to be controlled within the temperature range of 400° to 600° C., see U.S. Pat. No. 5,227,329. Trisilane is even less thermally stable than silane.

The ability to deposit very thin, smooth Si-containing films would satisfy a long-felt need and represent a significant advance in the art of semiconductor manufacturing, particularly for making future generations of microelectronic devices having ever-smaller circuit dimensions.

SUMMARY OF THE INVENTION

Methods have now been discovered that utilize trisilane to deposit high quality Si-containing films over a variety of substrates. See, e.g., U.S. Patent Applications (i) IMPROVED PROCESS FOR DEPOSITION OF SEMICONDUCTOR FILMS, Ser. No. 10/074,563, filed Feb. 11, 2002, (ii) DOPANT PRECURSORS AND PROCESSES, Ser. No. 10/074,149, filed Feb. 11, 2002, (iii) INTEGRATION OF HIGH K GATE DIELECTRIC, Ser. No. 10/074,722, filed Feb. 11, 2002, (iv) DEPOSITION OVER MIXED SUBSTRATES, Ser. No. 10/074,633, filed Feb. 11, 2002, (v) THIN FILMS AND METHODS OF MAKING THEM, Ser. No. 10/074,564, filed Feb. 11, 2002, and (vi) IMPROVED PROCESS FOR DEPOSITION OF SEMICONDUCTOR FILMS, Ser. No. 10/074,534, filed Feb. 11, 2002, which are hereby incorporated by reference herein in their entireties. However, implementing such methods into a commercially viable substrate processing apparatus creates several engineering challenges.

Thus, in accordance with one aspect of the invention, a substrate depositing apparatus comprises a carrier gas source, a liquid source container, a reactor and a vaporization chamber. The vaporization chamber comprises a body that forms a first inner surface that defines at least in part a cavity. The cavity is in communication with the carrier gas source through a gas line, the liquid source container through a supply line and the reactor through a feed line. The first inner surface is made from a first material that is non-ferric. A transition piece has a first surface made from the first material and a second surface made from a second material that is ferric. A connection between the vaporization chamber and at least one of the gas line, the supply line and the feed line extends from the first surface to the second surface and through the body of the vaporization chamber to the cavity. The connection including a connector that is attached to the second surface of the transition piece.

Another embodiment includes a vaporization chamber for a substrate processing system that comprises a main body, a cover member and a transition member. The main body is made of aluminum and defines a first inner surface, which defines, at least in part, a cavity. The cover member is also made of aluminum. The cover member defines a second inner surface, which also defines, at least in part, the cavity. The cover member comprises a carrier gas cover inlet, a liquid source cover inlet, a source cover outlet which extends from a first outer surface through the cover member to the second inner surface. The transition member is made of stainless steel and has a transition outer surface and a transition inner surface. The transition inner surface is aluminum clad. The cover member comprising a carrier gas cover inlet, a liquid source cover inlet, a source cover outlet which extend from a first outer surface through the cover member to second inner surface. The transition inner surface and the cover outer surface are welded together.

Another aspect of the invention is a vaporization chamber for vaporizing liquid trisilane. The chamber comprises a main body, which defines a chamber, a quantity of liquid trisilane within the cavity, a cover member and a transition member. The main body is made of a non-ferric material. The cover member is also made of a non-ferric material. The cover member defines a second inner surface, which also defines, at least in part, the cavity. The cover member comprising a carrier gas cover inlet, a liquid source cover inlet, a source cover outlet which extend from a first outer surface through the cover member to the second inner surface. The transition member is made of a ferric material and has a transition outer surface and a transition inner surface. The transition inner surface is aluminum clad. The cover member comprises a carrier gas cover inlet, a liquid source cover inlet, a source cover outlet which extend from a first outer surface through the cover member to second inner surface. The transition inner surface and the cover outer surface are welded together.

BRIEF DESCRIPTION OF THE DRAWINGS

FIGS. 1–16 are non-limiting illustrations (not to scale) of various preferred embodiments.

FIG. 1 is a schematic cross-sectional view illustrating a thin Si-containing film deposited onto a semiconductor substrate.

FIG. 2 is a schematic cross-sectional view illustrating a thin Si-containing film deposited onto a semiconductor substrate.

FIG. 3 is a schematic cross-sectional view illustrating a thin Si-containing film deposited over a step formed from a semiconductor and a dielectric material.

FIG. 5 is a schematic cross-sectional view illustrating the use of a thin Si-containing film as a wetting layer over the gate dielectric in a transistor gate electrode.

FIG. 8 is a schematic cross-sectional view illustrating an apparatus for depositing thin Si-containing films.

FIG. 9 is a reproduction of a cross-sectional photomicrograph showing a silicon film deposited onto a silicon dioxide substrate.

FIG. 10 is a reproduction of a cross-sectional photomicrograph showing a silicon film deposited onto a silicon dioxide substrate.

FIG. 11 is a front perspective view of a bubbler of the apparatus of FIG. 8 having certain features and advantages according to the present invention.

FIG. 12 is a top plan view of the bubbler of FIG. 11.

FIG. 13 is a side view of the bubbler of FIG. 11.

FIG. 14 is a cross-sectional view take through line 14—14 of FIG. 13.

FIG. 15 is a cross-sectional view taken through line 15—15 of FIG. 12.

FIG. 16 is a front view of the bubbler of FIG. 11 and a pair of connectors.

DETAILED DESCRIPTION OF THE PREFERRED EMBODIMENT

Figure 1:
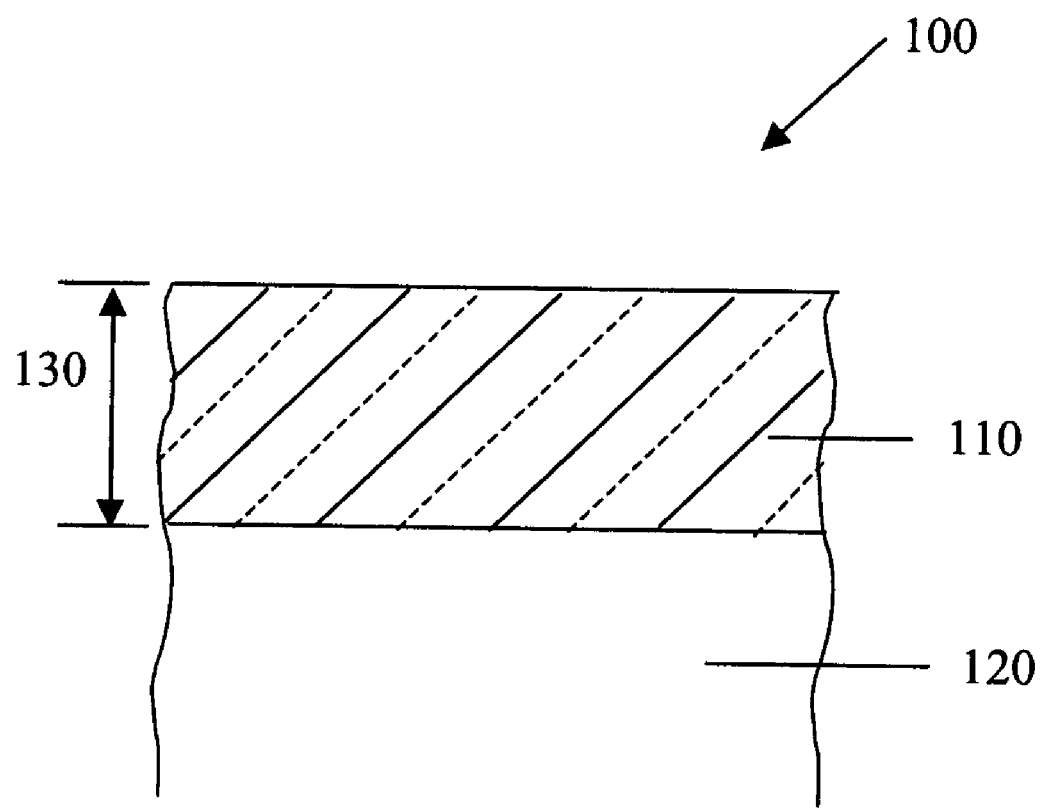

Manufacturers of microelectronic devices have long used silane ($SiH_4$) to deposit Si-containing films by CVD. Well-controlled and reproducible deposition processes are highly desirable in order to maximize device yield and production rate. However, it has been found that dynamic temperature variations, due to limitations in heating and temperature control systems, play a significant role in the non-uniformity of film deposition on substrate surfaces by CVD. It is generally desirable for the deposited film to be as uniform as possible in both thickness and elemental composition, but existing processes tend to produce films that are non-uniform to varying degrees. This is believed to result from, inter alia, temperature variations across the surface of the substrate because it has been found that the surface temperature of the substrate influences the deposition rate and the composition of the resulting film. Imperfect control over other process parameters, including gas flow rates and total pressure, are also believed to contribute to non-uniformities in film physical properties. It is also believed that temperature variations of SiC-coated graphite components (e.g., pre-heat ring and susceptor) in single wafer, horizontal gas flow reactors contribute to film non-uniformities.

Because of these process variations, the rate of deposition at any particular instant varies as a function of position on the film, resulting in thickness variations across the surface of the film. Similarly, the composition of the film that is being deposited at any particular instant in time varies from place to place across the surface of the substrate for multi-component films. The inventor believes that this is a direct consequence of the difference in dissociative absorption activation energy that exists between the precursors (including dopant precursors) used to introduce each of the elemental components of the multi-component film. This means that the averaging-out/tuning approaches discussed below do not necessarily solve the problem of compositional non-uniformity.

In many cases, manufacturing involves depositing Si-containing films during the process of making dozens or even hundreds of devices simultaneously on a wafer that is 200 millimeters (mm) in diameter. The industry is currently transitioning to 300 mm wafers, and may use even larger wafers in the future. Significant variations in the thickness and/or composition of the Si-containing films during the manufacturing process can lead to lower manufacturing yields when the affected devices do not meet the required performance specifications or standards. Also, variations across the film within a particular device can reduce device performance and/or reliability.

Thickness non-uniformity can be mitigated to a certain extent by depositing relatively thick films. This approach relies on the fact that non-uniformities tend to average out over the deposition time of any particular layer. Reactor process variables such as temperature and placement of heating lamps, gas flow rate, gas pressure, gas composition, etc. can be tuned to maximize the averaging-out process with respect to film thickness, particularly in single-wafer systems with rotating wafer support.

Tuning involves depositing a large number of films, each under a different pre-selected set of deposition conditions. The thickness variations within each film are then measured and the results analyzed to identify conditions that reduce or eliminate the thickness variations. The inventor has realized, however, that tuning does not necessarily achieve uniform temperature distributions throughout the process; rather, the result of the tuning process is to time-average the thickness variations produced by the temperature variations for a specific reaction temperature set point.

Accordingly, tuning does not necessarily produce uniform temperatures across the substrate throughout the deposition process. This, in turn, raises the issue of compositional variation because compositional homogeneity is desired in three dimensions, both across the film surface and through the film thickness. This is because many films contain dopants and the level of these dopants influences the electronic properties of the film. Non-uniform temperatures can result in non-uniform incorporation of dopants into the film. Similarly, other non-uniformities can result.

The problem of deposition non-uniformity is particularly acute when depositing very thin Si-containing films. The ability to produce thin films is becoming more important as circuit dimensions shrink and the resulting devices become more compact. However, the averaging-out/tuning approaches described above are becoming increasingly inadequate because the deposition process time for a thin film is generally shorter than for a thick film, allowing less time for film thickness to average-out. In addition, highly compact devices are more sensitive to compositional non-uniformities, a problem that is not adequately addressed by averaging-out/reactor tuning.

Film uniformity in thin films is also affected by nucleation phenomena. Nucleation is not completely understood, but silane deposition has been observed to occur by a process in which a number of separate silicon islands initially form on the surface of the substrate. As the deposition proceeds, these islands tend to grow until they contact one another, eventually forming a continuous silicon film. At this point the silicon film typically has a rough surface with peaks that correspond to the initial nucleation sites and valleys that correspond to the contact areas. The surface roughness is particularly evident when depositing doped layers over dielectric surfaces such as silicon oxide or silicon nitride. As deposition proceeds further and the film thickens, thickness uniformity increases by an averaging-out process similar to that described above.

Thin, continuous amorphous Si-containing films are generally very difficult to prepare by existing silane deposition processes because the film may reach the desired thickness in the regions near the peaks of the islands before the islands have grown together to form a continuous film. These problems are exacerbated for thinner films. Continuity problems are typically observed when using a silane deposition process to make films having a thickness of about 200 Å or less, and even more so for films having a thickness of less than about 100 Å. These problems are also exacerbated as the surface area of the film increases. Serious difficulties are often encountered for very thin films having a surface area of about one square micron or greater, and even more so for very thin films having a surface area of about 5 square microns or greater. The nature of the substrate can also complicate silane deposition to the extent that the surface influences nucleation and growth. Thus, for example, the deposition of very thin continuous amorphous Si-containing films over patterned dielectric substrates using silane is particularly challenging.

Film deposition methods that utilize a Si-containing precursor, preferably trisilane ($H_3SiSiH_2SiH_3$), have now been discovered that are much less sensitive to temperature variations across the surface of the substrate. In preferred embodiments, these methods are also much less sensitive to nucleation phenomena. Practice of the deposition methods described herein provides numerous advantages. For example, the methods described herein enable the production of novel Si-containing films that are uniformly thin, as well as doped Si-containing films in which the dopant is uniformly distributed throughout the film, preferably in both the across-film and through-film directions. The methods described herein also enable the production of very thin, continuous films. These advantages, in turn, enable devices to be produced in higher yields, and also enable the production of new devices having smaller circuit dimensions and/or higher reliability. These and other advantages are discussed below.

The Si-containing films described herein can be made by a variety of methods. Preferably, deposition is conducted under trisilane deposition conditions that are in or near the mass transport limited regime for trisilane. In the mass transport limited regime, deposition rates are essentially independent of temperature. This means that small temperature variations across the surface of the substrate have little or no effect on deposition rate. It has been found that this greatly minimizes thickness and compositional variations and enables the production of the preferred Si-containing films described herein.

Trisilane deposition conditions are preferably created by supplying sufficient energy to enable the trisilane to deposit at a rate that is controlled primarily by the rate at which it is delivered to the substrate surface, more preferably by heating the substrate as described below. A preferred deposition method involves establishing trisilane deposition conditions in a suitable chamber in the presence of trisilane and depositing a Si-containing film onto a substrate contained within the chamber.

Deposition of trisilane may be suitably conducted according to the various CVD methods known to those skilled in the art, but the greatest benefits are obtained when deposition is conducted according to the CVD methods taught herein. The disclosed methods may be suitably practiced by employing CVD, including plasma-enhanced chemical vapor deposition (PECVD) or thermal CVD, utilizing gaseous trisilane to deposit a Si-containing film onto a substrate contained within a CVD chamber. Thermal CVD is preferred.

In a preferred embodiment, trisilane is introduced to the chamber as a component of a feed gas. A suitable manifold may be used to supply feed gas(es) to the CVD chamber. Preferably, the gas flow in the CVD chamber is horizontal, most preferably the chamber is a single-wafer, horizontal gas flow reactor, preferably radiatively heated. Suitable reactors of this type are commercially available, and preferred models include the Epsilon® series of single wafer reactors commercially available from ASM America, Inc. of Phoenix, Ariz. While the methods described herein can also be employed in alternative reactors, such as a showerhead arrangement, benefits in increased uniformity and deposition rates have been found particularly effective in the horizontal, single-pass laminar gas flow arrangement of the Epsilon® chambers, employing a rotating substrate. CVD may be conducted by introducing a plasma to the chamber, but deposition in the absence of a plasma within the chamber is preferred, and thermal CVD is most preferred.

Trisilane is preferably introduced to the CVD chamber in the form of a feed gas or as a component of a feed gas. The total pressure in the CVD chamber is preferably in the range of about 0.001 torr to about 780 torr, more preferably in the range of about 0.1 torr to about 760 torr, most preferably in the range of about 1 torr to about 700 torr. The partial pressure of trisilane is preferably in the range of about 0.0001% to about 100% of the total pressure, more preferably about 0.001% to about 50% of the total pressure.

The feed gas can also include gases other than trisilane, such as inert carrier gases. Hydrogen and nitrogen are preferred carrier gases for the methods described herein. Preferably, trisilane is introduced to the chamber by way of a bubbler used with a carrier gas to entrain trisilane vapor, more preferably a temperature controlled bubbler.

The feed gas may also contain other materials known by those skilled in the art to be useful for doping or alloying Si-containing films, as desired. Preferably the gas is further comprised of an element selected from the group consisting of germanium, carbon, boron, arsenic, phosphorous, nitrogen and oxygen. More preferably the gas is further comprised of one or more compounds selected from the group consisting of the following non-limiting examples: silane, disilane, tetrasilane, germane, digermane, trigermane, $NF_3$, monosilylmethane, disilylmethane, trisilylmethane, tetrasilylmethane, hydrocarbons, ammonia, hydrazine, $N_2O$, $NO_2$, and a dopant precursor.

Incorporation of dopants into Si-containing films by CVD using trisilane is preferably accomplished by in situ doping using dopant precursors. Precursors for electrical dopants include diborane, deuterated diborane, phosphine, arsenic vapor, and arsine. Silylphosphines $[(H_3Si)_{3-x}PR_x]$ and silylarsines $[(H_3Si)_{3-x}AsR_x]$ where $x=0-2$ and $R_x=H$ and/or D are preferred precursors for phosphorous and arsenic dopants. Such dopant precursors are useful for the preparation of preferred films as described below, preferably boron-, phosphorous-, and arsenic-doped silicon, Si—C, Si—Ge and Si—Ge—C films and alloys.

The amount of dopant precursor in the feed gas may be adjusted to provide the desired level of dopant in the Si-containing film. Typical concentrations in the feed gas can be in the range of about 1 part per million (ppm) to about 1% by weight based on total feed gas weight, although higher or lower amounts are sometimes preferred in order to achieve the desired property in the resulting film. In the preferred Epsilon® series of single wafer reactors, dilute mixtures of dopant precursor in a carrier gas can be delivered to the reactor via a mass flow controller with set points ranging from about 10 to about 200 standard cubic centimeters per minute (sccm), depending on desired dopant concentration and dopant gas concentration. The dilute mixture is preferably further diluted by mixing with trisilane and any trisilane carrier gas. Since typical total flow rates for deposition in the preferred Epsilon® series reactors often range from about 20 standard liters per minute (SLM) to about 180 SLM, the concentration of the dopant precursor used in such a method is usually very small.

The relative partial pressures of trisilane and other components of the gas are preferably held relatively constant over the course of depositing the Si-containing film. Film thickness may be varied according to the intended application as known in the art, by varying the deposition time and/or gas flow rates for a given set of deposition parameters (e.g., total pressure and temperature). To achieve substantially uniform incorporation of a component into the resulting film, the component (or its precursor) and trisilane are preferably mixed together to form a homogenous gaseous mixture prior to deposition.

For thermal CVD using trisilane, deposition is preferably conducted at a substrate temperature of about 400° C. or greater, more preferably about 450° C. or greater, even more preferably about 500° C. or greater. Preferably, deposition takes place at a temperature of about 750° C. or less, more preferably about 650° C. or less, most preferably about 600° C. or less. Such temperatures are preferably achieved by heating the substrate to the indicated temperature. As temperatures are increased beyond 600° C., surface roughness tends to increase due to the transition to polycrystalline microstructure and deposition rates tend to be higher. Those skilled in the art can adjust these temperature ranges to take into account the realities of actual manufacturing, e.g., preservation of thermal budget, tolerance for surface roughness in a particular application, tolerance for compositional variations, etc. For example, deposition temperatures in the range of about 450° C. to about 525° C. are preferred for the deposition of extremely thin (e.g., about 10 Å to about 50 Å) amorphous silicon films onto an oxide substrate using trisilane. Preferred deposition temperatures thus depend on the desired application, but are typically in the range of about 400° C. to about 750° C., preferably about 425° C. to about 650° C., more preferably about 450° C. to about 550° C.

Deposition of the films described herein is preferably conducted at a rate of about 5 Å per minute or higher, more preferably about 10 Å per minute or higher, most preferably about 20 Å per minute or higher. Better thickness uniformity is generally achieved at relatively lower deposition rates, particularly for relatively thin films.

Preferred trisilane deposition methods enable the production of thin, continuous, Si-containing films over various substrates. A schematic cross-sectional view (not to scale) illustrating such a preferred structure 100 is shown in FIG. 1, showing a Si-containing film 110 deposited directly on a substrate 120. A preferred substrate comprises a non-single crystal material, more preferably comprises a dielectric material having a dielectric constant of about 2.2 or higher. Examples of preferred dielectric materials include various silicon oxides and metal oxides, metal silicates, silicon oxynitrides and silicon nitrides.

The Si-containing film is preferably amorphous. The Si-containing film can comprise one or more other elements in addition to silicon such as germanium, nitrogen, carbon, boron, arsenic, phosphorous, and antimony. Preferred dopants for Si-containing films are arsenic, boron and phosphorous. The dopant concentration in Si-containing films, when doped, is preferably in the range of from about $1 \times 10^{14}$ to about $1 \times 10^{21}$ atoms/cm$^3$.

Preferably, the one or more other elements are distributed more uniformly throughout the Si-containing film than when silane is used as the silicon source. More preferably, the one or more other elements are distributed substantially uniformly such that the electrical properties of the Si-containing film do not vary significantly as a function of position. For example, the electrical conductivity of a boron-doped Si-containing film located near the edge of a wafer is preferably substantially the same as the electrical conductivity of a boron-doped Si-containing film located near the middle of a wafer, at a given point in the thickness of the film. Compositional uniformity can be determined by using electrical measurements (e.g., 4-point probe), SIMS (Secondary Ion Mass Spectrometry), RBS (Rutherford Backscattering Spectroscopy), Spectroscopic Ellipsometry and/or high resolution X-ray diffractometry (HR-XRD). Compositional non-uniformity is preferably about 5% or less, more preferably 2% or less, most preferably 1% or less.

The deposition methods described herein can be used to deposit thicker films, but particularly advantageous aspects of these methods are realized when the thickness of the Si-containing film is about 500 Å or less. The methods described herein tend to become progressively more useful as film thickness decreases and thus are preferably used to deposit preferred Si-containing films having a thickness of about 150 Å or less, more preferably about 125 Å or less, most preferably less than about 100 Å. Preferred Si-containing films have a thickness of about 15 Å or more, more preferably about 20 Å or more, most preferably about 25 Å or more, in order to better ensure continuity of the deposited film. The methods described herein thus enable the deposition of preferred Si-containing films having thicknesses that are in the range of about 15 Å to about 150 Å, more preferably about 20 Å to about 125 Å, most preferably about 25 Å to less than about 100 Å.

Figure 2:
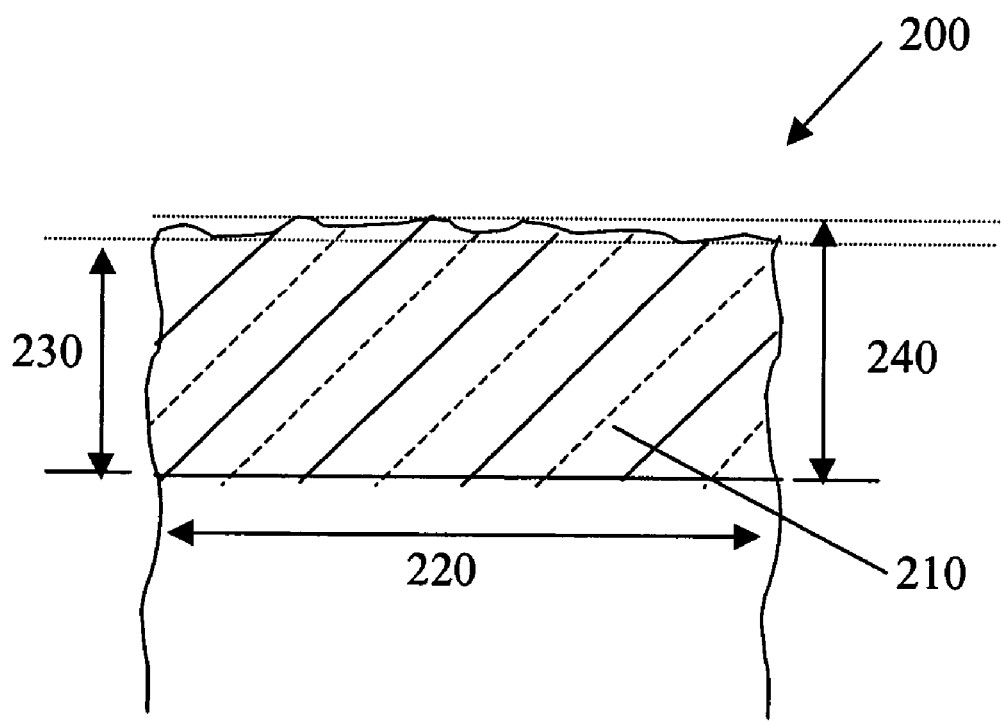

Suitable methods for measuring film thickness include multiple-point ellipsometric methods. Instruments for measuring film thickness are well known and commercially available. Preferred instruments include the NanoSpec® series of instruments from Nanometrics, Inc., Sunnyvale, Calif. The thickness of a Si-containing film can also be determined by cross-sectioning the substrate and measuring the thickness by an appropriate microscopy technique, most preferably by electron microscopy. For example, FIG. 1 illustrates the cross-sectional measurement of thickness 130. The span over which a thickness is measured can be any span in the range of from about 10 times the thickness of the film to the entire span of the Si-containing film. If the thickness varies over the span, then the thickness is considered to be the average thickness, i.e., the numerical average of the thickest and thinnest dimensions of the film over a given span. For example, for the structure 200 illustrated in FIG. 2, the Si-containing film 210 has an average thickness over the span 220 that is equal to one-half of the sum of thickness 230 and thickness 240.

As used herein, rms (more properly, the square root of the mean squared error) is a way of expressing the amount of variability exhibited by the members of a given population. For example, in a group of objects having an average weight of y grams, each member of the group has a weight y' that differs from the average by some amount, expressed as (y'−y). To calculate rms, these differences are squared (to ensure that they are positive numbers), summed together, and averaged to yield a mean squared error. The square root of the mean squared error is the rms variability.

Preferred Si-containing films have a thickness that is highly uniform across the surface of the film. Film thickness uniformity is preferably determined by making multiple-point thickness measurements as discussed above, e.g. by ellipsometry or cross-sectioning, determining the mean thickness by averaging the various thickness measurements, and determining the rms variability. To enable comparisons, the results can be expressed as percent non-uniformity, calculated by dividing the rms thickness variability by the average thickness and multiplying by 100 to express the result as a percentage. Preferably, the thickness non-uniformity is about 20% or less, more preferably about 10% or less, even more preferably about 5% or less, most preferably about 2% or less.

Figure 3:
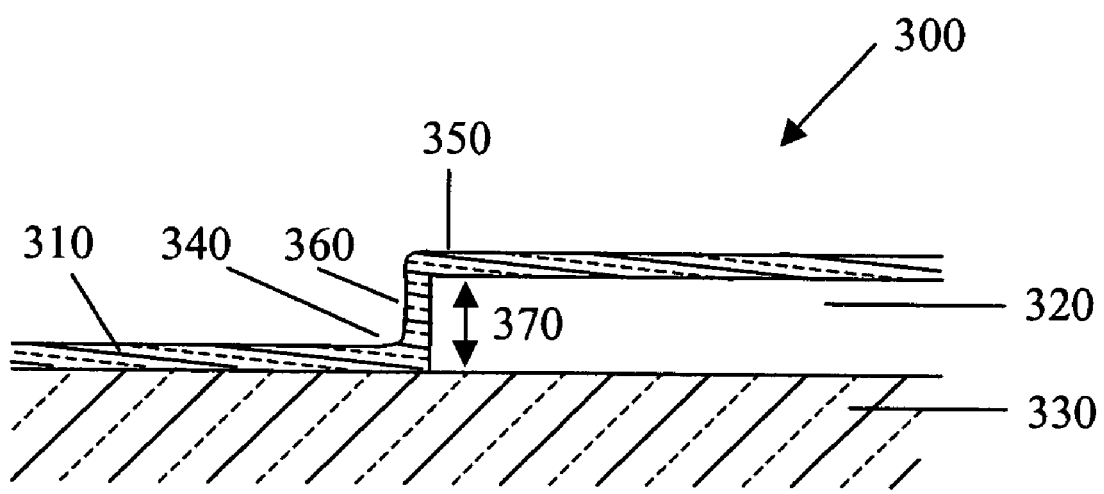
Figure 4A:
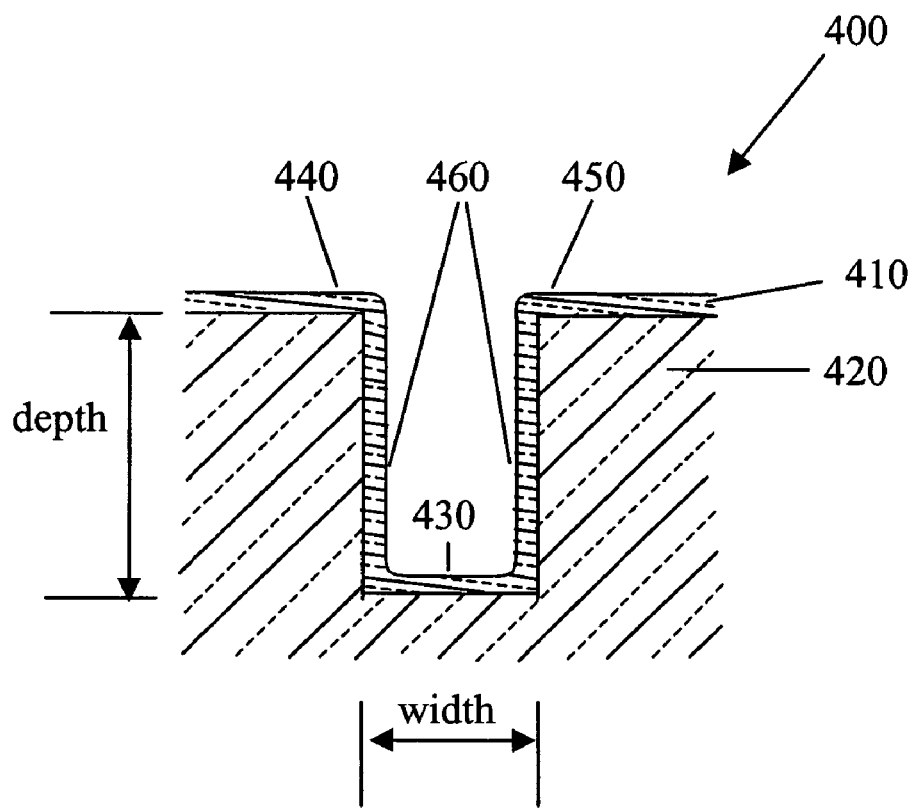
FIG. 4A is a schematic cross-sectional view illustrating a thin Si-containing film deposited over a trench formed in a semiconductor.

The Si-containing film preferably provides conformal coating over varied topography. A conformal coating is a layer that follows the curvature, if any, of the layer that it overlies. Preferred Si-containing films exhibit good step coverage. "Step coverage" refers to the thickness uniformity of a conformal Si-containing film that overlies a stepped surface. A stepped surface is a surface that has two or more parallel components that are not disposed in the same horizontal plane. For example, FIG. 3 illustrates a structure 300 in which a Si-containing film 310 exhibits good step coverage over the step created by the presence of silicon oxide layer 320 on silicon substrate 330. Step coverage is preferably determined by measuring the average thickness of the Si-containing film at the bottom of the step 340, dividing it by the average thickness at the top of the step 350, and multiplying by 100 to express the result in percentage terms. Likewise, FIG. 4A illustrates a trench structure 400 in which a Si-containing film 410 exhibits good step coverage over the trench in semiconductor substrate 420. Step coverage is preferably determined similarly by measuring the average thickness of the Si-containing film at the bottom of the trench 430, dividing it by the average thickness at the top of the trench 440 and 450, and multiplying by 100 to express the result in percentage terms. Preferred Si-containing films have good step coverage even at relatively high aspect ratios. "Aspect ratio" refers to the ratio of the vertical height of the step to the horizontal width of the structure. For example, the aspect ratio of the trench illustrated in FIG. 4 is equal to trench width 470 divided by trench depth 480.

At an aspect ratio in the range of about 4.5 to about 6, preferred Si-containing films have a step coverage of about 70% or greater, preferably 80% or greater. At an aspect ratio in the range of about 1 to about 4, preferred Si-containing films have a step coverage of about 80% or greater, preferably 90% or greater. Step coverage is preferably calculated as stated above, but can also be calculated by taking into account sidewall thickness 360 or 460. For example, alternate definitions of step coverage involve the ratio of the sidewall thickness to the average thickness at the top and/or bottom of the step, e.g., thickness 460 divided by thickness 430, or thickness 460 divided by the average of thickness 440 and 450. However, unless otherwise stated, step coverage herein is determined as stated above by measuring the average thickness of the horizontal portions of the Si-containing film at the bottom of the step, dividing it by the average thickness of the horizontal portions at the top of the step, and multiplying by 100 to express the result in percentage terms.

Advantageously, surface smoothness and thickness of the Si-containing film as defined herein is maintained over a surface area of about one square micron ($\mu m^2$) or greater, more preferably about 5 $\mu m^2$ or greater, even more preferably about 10 $\mu m^2$ or greater. The Si-containing film can cover all or part of a large substrate, e.g., a wafer, and thus can have a surface area of about 300 $cm^2$ or greater, preferably about 700 $cm^2$ or greater. A surface can be characterized as being in contact with a particular material, and thus a surface area in contact with a particular layer can be specified. For example, a Si-containing film can overlie a dielectric material and a semiconductor material. Preferably, the Si-containing film has a surface area in contact with the dielectric material of about 5 $\mu m^2$ or greater, more preferably about 10 $\mu m^2$ or greater. More preferably, the Si-containing film is a conformal coating.

Since good step coverage is usually achieved, in many cases the surface roughness of the Si-containing film is substantially the same as the roughness of the surface that it overlies. Surface roughness is preferably rms surface roughness as measured by atomic force microscopy (AFM) on a 1 micron×1 micron portion of surface in question. The roughness of the underlying substrate surface can range from about 1 Å rms (atomically flat surface) up to about 25 Å rms or even higher. Preferably, the underlying substrate surface has a roughness of 10 Å rms or less, more preferably 5 Å rms or less, so that the overlying Si-containing film has a comparable roughness. For an underlying substrate surface having a given degree of roughness, the Si-containing film deposited thereon preferably has a surface roughness that is greater than the substrate surface roughness by an amount of about 5 Å or less, more preferably about 3 Å or less, even more preferably about 2 Å or less. For example, if the substrate surface roughness is about 7 Å rms, then the measured surface roughness of the Si-containing film deposited thereon is preferably about 12 Å rms (7 Å+5 Å) or less. Preferably, the underlying surface has a roughness of about 2 Å rms or less and the overlying Si-containing film has a measured surface roughness of about 5 Å rms or less, more preferably about 3 Å rms or less, most preferably about 2 Å rms or less.

Preferred Si-containing films are thin and continuous over an area of about 1 $\mu m^2$ or greater, more preferably about 5 $\mu m^2$ or greater, even more preferably about 10 $\mu m^2$ or greater. As film thicknesses decreases, film continuity over such areas tends to become progressively more difficult to achieve. The methods described herein are useful for preparing thicker continuous Si-containing films, but are particularly useful for depositing continuous films having a thickness of about 125 Å or less, even more so for films having a thickness of less than about 100 Å, and especially useful for films having a thickness of about 80 Å or less.

Various materials can be deposited in the usual fashion over the Si-containing materials described herein, including metals, dielectric materials, semiconductors, and doped semiconductors. Si-containing materials may also be subjected to other semiconductor manufacturing processes such as annealing, etching, ion implantation, polishing, etc.

Figure 5:
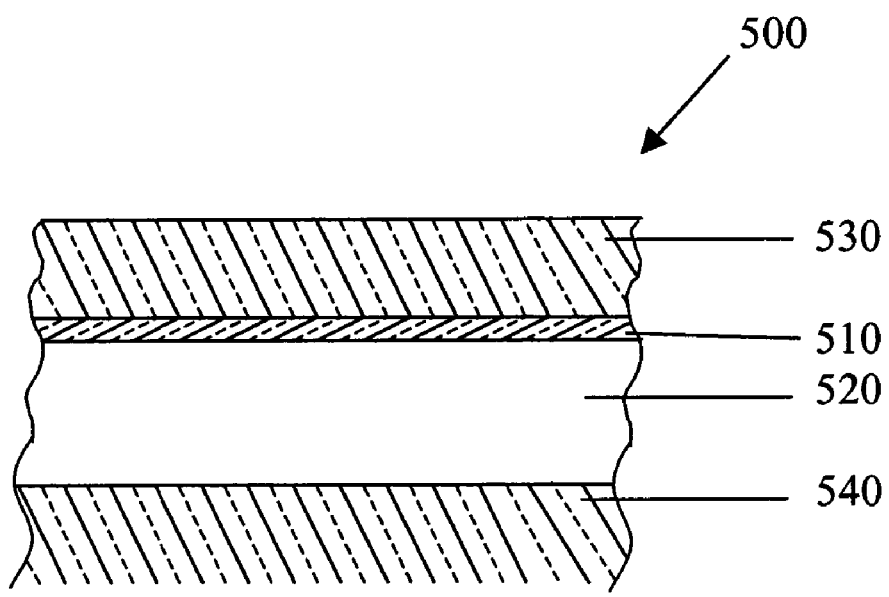

A preferred embodiment provides a wetting layer useful for making multilayer structures comprised of different materials. For example, the method of making a transistor gate electrode involves depositing a semiconductor layer, such as doped silicon, doped silicon germanium, doped silicon carbon or doped silicon germanium carbon onto a dielectric material such as silicon dioxide. The deposition method can be improved by first depositing a wetting layer onto the dielectric material, then depositing the semiconductor layer onto the wetting layer. FIG. 5 illustrates a portion of a gate electrode 500 having such a wetting layer 510 sandwiched between dielectric layer 520 and gate electrode 530 (source and drain structures not shown).

Figure 6A:
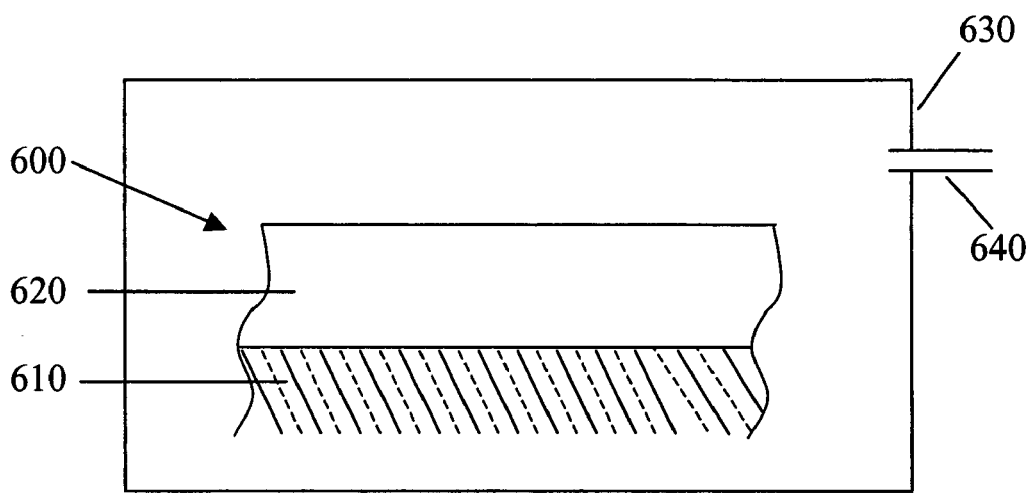
FIGS. 6A to 6C are schematic cross-sectional views illustrating a sequence for depositing a thin Si-containing film as a wetting layer in a transistor gate electrode deposition process.
Figure 6B:
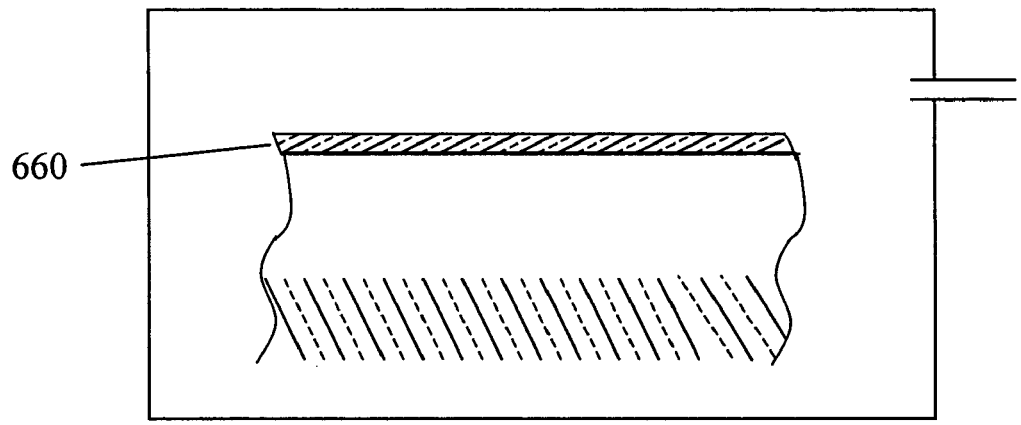
Figure 6C:
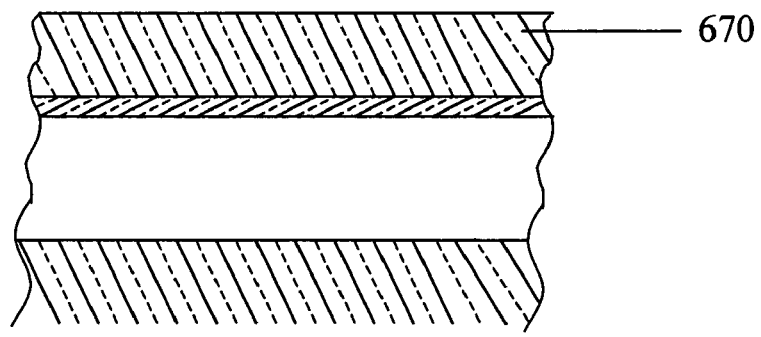

A preferred method for making a transistor gate electrode is illustrated schematically by the sequence in FIGS. 6A to 6C (not to scale, source and drain not shown). A substrate 600 comprising a semiconductor substrate 610, preferably doped silicon, and an overlying thin gate dielectric layer 620, preferably silicon dioxide, is placed into a chamber 630. Trisilane deposition conditions are established, preferably by heating the substrate 600 to a temperature in the range of about 450° C. to about 550° C., and a gas comprising trisilane is introduced to the chamber 630 via a feed line 640. An amorphous silicon film having a thickness in the range of about 25 Å to about 100 Å and a surface roughness of about 5 Å rms or less is deposited onto the dielectric layer 620 to form a wetting layer 660. A gate electrode is then formed by depositing a semiconductor layer, preferably doped silicon, more preferably doped Si—Ge, doped Si—C, or doped Si—Ge—C onto the wetting layer 660. A thin, continuous amorphous silicon wetting layer improves the uniformity of the overlying semiconductor layer and presents a minimal barrier to the diffusion of elements such as germanium to the interface with the gate dielectric 620.

Another preferred embodiment provides a method of forming quantum dots. A quantum dot is a particle of material in which one or more electrons are confined to a region having a maximum dimension in any direction that is less than or equal to the electron wavelength, so that the electrons are essentially confined to zero dimensions. The electrons in a quantum dot occupy well-defined, discrete quantum states that are a function of the size of the confinement region.

Potential practical applications for quantum dots include quantum optical devices (e.g., lasers and detectors) and quantum electronic devices (e.g., diodes and transistors). However, such applications have been slow to develop because of the difficulty of fabricating such structures, see E. Corcoran and G. Zorpette, "Diminishing Dimensions," Scientific American, October 1997. Using the trisilane deposition methods described herein, quantum dots having more uniform size and/or distribution can be made, as compared to methods utilizing silane.

Figure 7A:
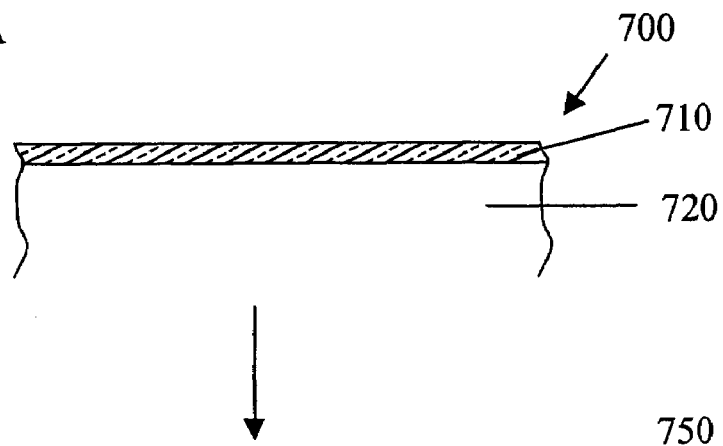
FIGS. 7A to 7C are schematic cross-sectional views illustrating a sequence for depositing a thin Si-containing film and annealing to form quantum dots.
Figure 7B:
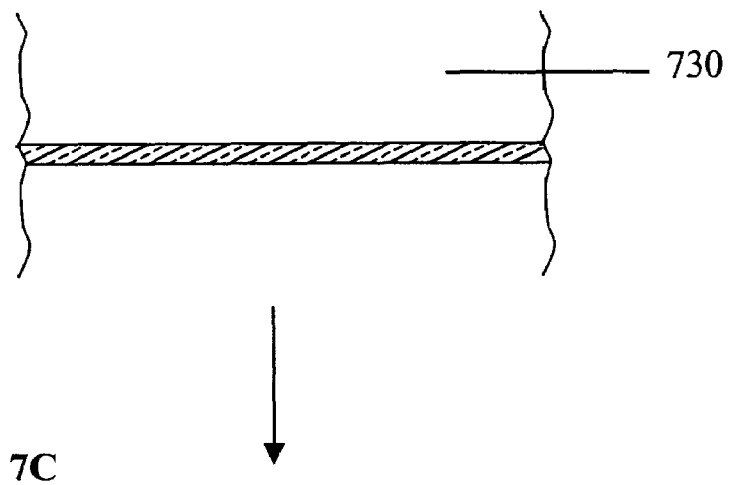
Figure 7C:
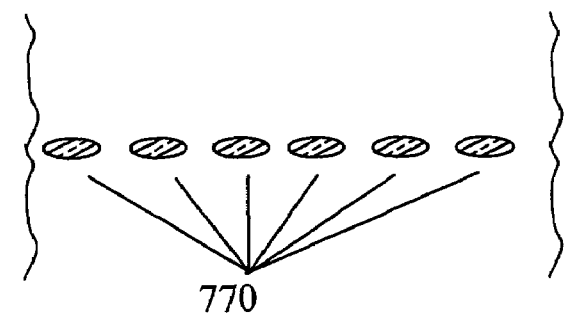

A preferred method for making quantum dots is illustrated schematically by the sequence shown in FIGS. 7A to 7C. The method is based on the observation that discrete Si-containing particles can be formed on a surface by annealing an amorphous Si-containing film previously deposited thereon. This invention is not bound by theory, but it is believed that annealing causes the thin film to break apart into regions that further agglomerate into separated crystalline grains. Annealing a non-uniform film results in quantum dots that are similarly non-uniform, whereas annealing the uniform films described herein results in quantum dots having greater size and/or spatial uniformity.

A preferred method for making quantum dots is now described with reference to FIG. 7, although it will be understood that the method is not limited to this preferred embodiment. Structure 700 is formed by depositing a Si-containing film 710 onto a dielectric structure 720. In this method, the dielectric layer 720 preferably comprises silicon dioxide over a semiconductor substrate. More preferably, dielectric 720 is a tunnel oxide having a thickness of about 100 Å or less, preferably about 50 Å or less. Dielectric 720 is placed into a chamber (not shown) and heated to a temperature in the range of about 450° C. to about 550° C. while trisilane and, optionally, dopant precursor are introduced to the chamber, to deposit onto the dielectric 720 a thin, smooth, continuous Si-containing film 710 having a thickness in the range of about 25 Å to about 100 Å and a surface roughness of about 5 Å rms or less. Film 710 can then be annealed to form a plurality of quantum dots (not shown) or, preferably, a second dielectric layer 730, preferably also comprising silicon dioxide, is deposited onto film 710. The resulting structure 750 is then annealed, preferably at a temperature in the range of about 600° C. to about 800° C., to form a plurality of quantum dots 770. Quantum dots can also be made by the method described in U.S. Pat. No. 6,235,618, except that the silicon thin film is not formed using a silicon vapor deposition technique as described therein, but is instead deposited using trisilane as described herein.

Because the film 710 is thin and uniform, the resultant quantum dots 770 have a more uniform size and/or spatial distribution than those made by a comparable silanebased method. Preferred quantum dots have a grain size of about 200 Å or less, preferably about 100 Å or less, depending on the desired application. Size uniformity is preferably determined by measuring average quantum dot size and rms size variability. Preferably, rms size variability is about 15% or less, preferably 10% or less, based on the average quantum dot size. For example, for a structure having an average quantum dot size of 50 Å, the size variability is preferably 7.5 Å rms (15% of 50 Å) or less. Spatial uniformity is preferably determined by measuring the average number of quantum dots per given area and the rms spatial variability. Preferably, the rms spatial variability is about 5% or less. For example, for a structure having an average of 50 quantum dots per 0.1 $\mu m^2$, the spatial variability is preferably 2.5 per 0.1 $\mu m^2$ rms (5% of 50) or less. Quantum dots as described herein are useful in a number of applications, e.g., single electron transistors, quantum dot infrared photodetectors, and sparse carrier devices, see U.S. Pat. Nos. 6,194,237; 6,211,013; 6,235,618; 6,239,449; and 6,265,329, all of which are hereby incorporated by reference in their entireties, and particularly for the express purpose of describing quantum structures, fabrication methods, and applications.

Another preferred embodiment provides a method for making a diffusion source or diffusion layer. A diffusion source is a layer that acts as a source of one or more dopant elements. Such diffusion layers are typically deposited in close proximity to a region where the dopant is desired, then heated to drive the dopant from the diffusion layer to the desired destination. However, there are limitations on the use of such diffusion sources. For example, the deposition and drive steps are time-consuming, and the heating involved in these steps may exceed thermal budgets. Other doping methods such as ion implantation can be used, but shallow implantation is difficult to achieve by ion implantation.

Thus, there is a problem in making shallow doped regions such as shallow source-drain junctions. To minimize the impact on thermal budgets, attempts have been made to deposit thin diffusion sources in order to reduce the length of the diffusion pathway. However, such attempts using silane as the silicon source have been unsatisfactory because the deposition temperature for silane is high and because thickness non-uniformities in the diffusion layer resulted in corresponding dopant non-uniformities after the drive step.

It has now been discovered that thin, uniform Si-containing diffusion sources can be made using trisilane as the silicon source. These diffusion sources are preferably made by introducing trisilane and a dopant precursor to a chamber and depositing a highly doped Si-containing film by thermal CVD onto a substrate, in close proximity to the ultimate destination for the dopant. The amount of dopant precursor introduced to the chamber can vary over a broad range, depending on the ultimate application, but is preferably effective to provide a dopant concentration in the resulting diffusion source in the range of from about $1 \times 10^{16}$ to about $1 \times 10^{22}$ atoms/cm$^3$. The ratio of dopant precursor to trisilane introduced to the chamber can range from about 0.00001% to 150%, preferably about 0.001% to about 75%, by weight based on total weight of trisilane and dopant precursor.

Diffusion layer deposition temperatures can be in the range of from about 400° C. to about 650° C., but are preferably in the range of about 450° C. to about 600° C. Lower deposition temperatures tend to have a smaller impact on thermal budgets and provide smoother, more continuous films, but higher temperatures tend to provide faster deposition. The thickness of the diffusion source is preferably in the range of about 25 Å to about 150 Å, more preferably about 50 Å to about 100 Å. The diffusion source is preferably a continuous Si-containing film having a substantially uniform thickness, more preferably having a thickness non-uniformity of about 10% or less, and a substantially uniform distribution of dopant(s).

Hemispherical grain (HSG) silicon films are known, see, e.g., U.S. Pat. Nos. 5,885,869; 5,837,580; and 5,656,531. HSG silicon films can be made by annealing an amorphous Si-containing film to roughen the surface to varying degrees, depending on film thickness, annealing time and annealing temperature. It is believed that the silicon atoms migrate at the annealing temperature to form crystalline regions that are thermodynamically favored at the annealing temperature. The presence of the crystalline grains produces surface roughness that appear as generally hemispherical mounds on the surface. The size of the grains is generally greater than about 200 Å, preferably about 300 Å to about 500 Å.

HSG silicon films are useful in the fabrication of capacitors to increase surface area. The art generally depicts HSG silicon in an idealized fashion having uniform grain size and distribution. However, those skilled in the art are aware that current techniques generally produce HSG silicon in which the grains are of varying size and not evenly distributed across the surface of the substrate. Non-uniformities in grain size and distribution tend to negatively impact device performance and reliability.

Figure 4B:
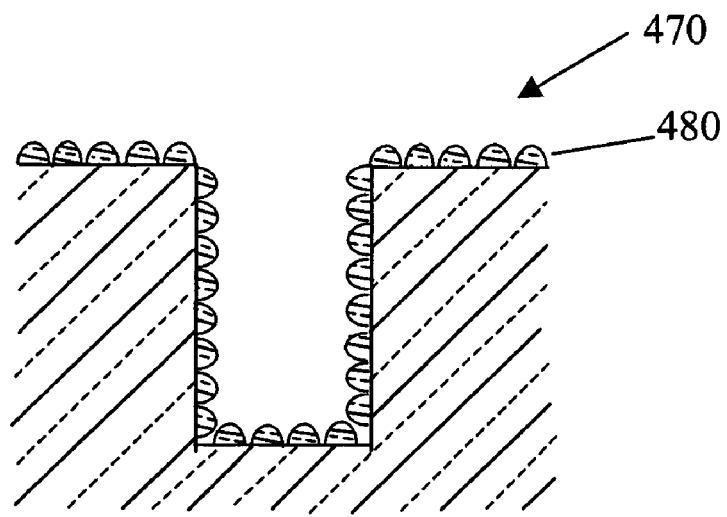
FIG. 4B illustrates HSG silicon formed by annealing the thin Si-containing film.

Thin uniform Si-containing films as described herein are an ideal precursor for HSG silicon. For example, FIG. 4B depicts a structure 470 in which HSG silicon film 480 is formed by annealing a silicon film 410 as shown in FIG. 4A. HSG films formed within cavities are useful in the fabrication of stacked container capacitors and trench capacitors. Similarly, stud capacitors can be formed by annealing a Si-containing film deposited onto the exterior of a post or stud, thus involving similarly challenging steps over which to deposit. Capacitors formed from HSG films are useful in a variety of applications, preferably in DRAM devices.

As DRAM devices continue to be scaled down and the sidewalls of the cavity become closer together in the horizontal direction, current HSG fabrication methods will become increasingly inadequate. Oversize grains resulting from non-uniformities in the precursor film will be more likely to come into contact, leading to electrical shorts across the cavity and consequent loss of capacitance. If future DRAM devices are to be made by depositing a silicon film within a trench or hole and annealing to form HSG silicon, then successful fabrication is likely to be facilitated by processes that allow for precise control of the morphology of the HSG silicon on the inner surfaces of deep cavities. Specifically, it would be highly desirable to be able to deposit thin amorphous silicon films with good step coverage uniformly over steep steps, such as the inner surfaces of deep cavities, to provide films suitable for annealing to produce HSG silicon.

The ability to deposit thin smooth Si-containing films as described herein enables the preparation of HSG silicon over structures with smaller feature sizes than when using silane, permitting extension to smaller critical dimensions. Thus, a preferred embodiment provides a method comprising introducing trisilane to a chamber, depositing an amorphous Si-containing film, and annealing the film to form HSG silicon. The chamber preferably contains a substrate at a temperature of about 450° C. to 600° C., more preferably about 450° C. to about 520° C., and an amorphous Si-containing film is deposited onto the substrate by thermal CVD of the trisilane. Preferably, the amorphous Si-containing film has a thickness in the range of about 10 Å to about 150 Å, preferably about 50 Å to about 100 Å, and a surface roughness of about 5 Å rms or less, preferably about 2 Å rms or less. More preferably, the amorphous Si-containing film has a thickness non-uniformity of about 10% or less. The amorphous Si-containing film is then annealed to form HSG silicon, preferably by heating to a temperature in the range of about 600° C. to about 700° C. It has been found that Si-containing films, when annealed as described, form HSG silicon having a finer and more uniform grain structure.

Average grain size and spatial distribution of HSG silicon is preferably determined by measuring the average grain size and average number of grains per given area by cross-sectioning the structure and subjecting it to transmission electron microscopy. Preferably, rms grain size is about 15% or less, preferably 10% or less, based on the average grain size. For example, for a structure having an average grain size of 300 Å, rms grain size variability is preferably 45 Å rms (15% of 300 Å) or less. Spatial uniformity is preferably determined by measuring the average number of grains per given area and the rms spatial variability. Preferably, the rms spatial variability is about 10% or less, more preferably 5% or less. For example, for a structure having an average of 25 grains per 0.1 $\mu m^2$, the rms spatial variability is preferably 2.5 per 0.1 $\mu m^2$ rms (10% of 25) or less. Average grain size is preferably about 200 Å or greater, more preferably in the range of about 250 Å to about 500 Å.

The Si-containing films described herein are also useful as anti-reflective coatings. Photolithographic processes using intense sources of electromagnetic radiation are typically employed to pattern substrates in semiconductor manufacturing. Anti-reflective coatings are frequently applied to surfaces in order to reduce the amount of reflected radiation. The coating is usually designed so that its anti-reflective properties are maximized for the type of incident radiation by adjusting the thickness of the coating to be some multiple of the wavelength of the radiation. It is generally desirable for the multiple to be as small as possible in order to avoid secondary optical effects, but it is generally more difficult to prepare such thin, optical-quality films. In addition, as device dimensions have gotten smaller, the wavelength of incident radiation used for photolithography has also become shorter, with a commensurate decrease in the desired thickness for the anti-reflective coating.

A preferred embodiment provides anti-reflective coatings useful in semiconductor manufacturing. Preferred antireflective coatings comprise a Si-containing film as described herein that has a substantially uniform thickness, more preferably a thickness non-uniformity of about 10% or less, so that the antireflective properties are substantially constant across the surface of the substrate. The thickness of the anti-reflective coating is preferably selected to be effective to suppress reflection of at least part of the incident radiation, more preferably about 75% or less of the incident radiation is reflected. Typical thicknesses are lower multiples of the wavelength of the incident radiation, preferably about 100 Å to about 4000 Å, more preferably about 300 Å to about 1000 Å. The Si-containing film preferably comprises elemental nitrogen, oxygen and/or carbon, and is more preferably selected from the group consisting of Si—N, Si—O—N, and Si—C—N. Preferred anti-reflective coatings are preferably deposited using trisilane and, optionally, an oxygen, nitrogen and/or carbon precursor, using the deposition techniques taught elsewhere herein. Preferred oxygen precursors include diatomic oxygen and ozone; preferred nitrogen precursors include hydrazine and ammonia; and preferred carbon precursors include alkyl silanes and silylated alkanes.

In another preferred embodiment, integrated circuits are provided, comprised of a Si-containing film such as described herein. Methods for making such integrated circuits from Si-containing films are known to those skilled in the art. The use of trisilane enables the extension of current device designs to smaller critical dimension by virtue of the fact that thinner films can be controllably deposited at commercially meaningful deposition rates. These integrated circuits may be incorporated into computer systems by methods known to those skilled in the art and thus a further preferred embodiment provides a computer system comprised of one or more of such integrated circuits. As used herein, "computer system" includes silicon-based devices capable of performing calculations and/or storing information in digital form. "Computer system" thus includes any device into which an integrated circuit may be incorporated.

The methods described herein can increase semiconductor manufacturing device yield. Semiconductor device manufacturing generally involves starting with a wafer substrate having a surface area of about 300 $cm^2$ or greater, e.g., a wafer having a diameter of 200 or 300 millimeters or even larger. The wafer is subjected to dozens or even hundreds of processing steps to produce a finished wafer that comprises dozens or even hundreds of semiconductor devices. The finished wafer is then cut to separate the devices from one another, producing a total number $N_T$ of completed semiconductor devices.

It is highly desirable for each step in the manufacturing process to be as uniform as possible so that all of the completed semiconductor devices has the desired performance characteristics. However, it is often the case that the process produces a number $N_A$ of acceptable devices, i.e., devices that meet the desired performance specifications, and a number $N_U$ of unacceptable devices that do not meet the specifications. Since the unacceptable devices must frequently be scrapped, the device yield for a particular process, $N_A/N_T$, is a parameter that is usually very important to the manufacturer.

Many semiconductor device manufacturing processes have manufacturing steps in which a Si-containing film is deposited onto a substrate using silane. However, with the ongoing trend toward larger wafers and more compact devices, it is becoming increasingly difficult to maintain device yields because of the aforementioned problems associated with the use of silane. For example, with the deposition of thinner Si-containing layers, it is becoming increasingly difficult to tune the process to compensate for thickness and/or compositional variations across the surface of the wafer, particularly for larger wafers.

It has now been discovered that the yield of a semiconductor device manufacturing process that utilizes silane can be improved by replacing the silane with trisilane. Although the replacement may improve yields in a variety of processes, it has preferred utility when the process involves depositing a Si-containing film having an average thickness of about 1000 Å or less, and becomes increasingly preferred as film thickness is decreased. Thus, the replacement is useful for depositing films having a thickness of about 300 Å or less, even more useful for depositing films having a thickness of about 150 Å or less, and especially useful when for depositing films having a thickness of about 100 Å or less. Likewise, the replacement is particularly useful for improving yields when the surface area of the substrate is about 300 cm² or greater; and even more so when the surface area is about 700 cm² or greater.

Since the value of individual semiconductor devices is often quite high, even small increases in yield can result in significant cost savings for the manufacturer. Preferably, the replacement of silane with trisilane improves device yield by about 5% or more, more preferably about 10% or more, calculated as (trisilane device yield−silane device yield)/silane device yield, and multiplying by 100 to express the result as a percentage.

A preferred replacement method involves modifying a CVD process to take advantage of the ability to deposit trisilane at a lower temperature, e.g., using the temperature parameters discussed above for the thermal CVD of trisilane. For example, where the semiconductor device manufacturing process comprises thermal CVD of silane at a temperature $T_s$, the replacement of silane with trisilane preferably further involves reducing the deposition temperature to $T_t$, where $T_s > T_t$. Such temperature reductions advantageously conserve thermal budgets, and are preferably about 10% or greater, more preferably about 20% or greater, calculated as $(T_s - T_t)/T_s$, and multiplying by 100 to express the result in percentage terms. Preferably, $T_t$ is in the range of about 450° C. to about 600° C., more preferably in the range of about 450° C. to about 525° C. Preferably, the process of introducing silane to the chamber is also modified when replacing the silane with trisilane to take into account the liquid nature of trisilane at room temperature as discussed above, e.g., by using a bubbler, heated gas lines, etc.

EXAMPLES

The following experiments were carried out using an ASM Epsilon E2500™ horizontal flow reactor system, configured with a Bernoulli wand wafer transfer system, purge-only load locks, a concave susceptor with grooves in the top surface to prevent wafer slide upon drop-off, a square pre-heat ring, adjustable spot lamps and independently tunable gas inlet injectors.

Example 1

An eight-inch diameter (200 mm)<100> silicon wafer substrate having a 1,000 Å SiO₂ layer was placed into the reactor chamber and allowed to reach thermal equilibrium at 450° C. at 40 Torr pressure under a flow of 20 standard liters per minute (slm) of high purity hydrogen gas. Trisilane was introduced to the chamber by passing high purity hydrogen gas through liquid trisilane using a bubbler (maintained at room temperature using a water bath around the vessel containing the trisilane) connected by a feed line to the chamber. A flow rate of 180 standard cubic centimeters per minute (sccm) of the hydrogen/trisilane mixture, along with a flow of 90 sccm (inject) of diborane (100 ppm, 90 sccm mixed with 2 slm high purity hydrogen), was then passed into the reactor for four minutes. A continuous, boron-doped, amorphous silicon film having a total thickness of 56 Å and a surface roughness of about 2 Å rms (comparable to the underlying silicon dioxide) was deposited on the silicon dioxide layer at a deposition rate of 14 Å per minute. A layer of epoxy was then applied to facilitate cross-sectional sample preparation.

Example 2 (Comparative)

The process of Example 1 is repeated except that silane is used instead of trisilane. Since silane is a gas under the experimental conditions, it is introduced to the chamber directly in admixture with hydrogen, without the use of a bubbler. No meaningful deposition is observed and no Si-containing film is obtained.

Example 3

Figure 10:
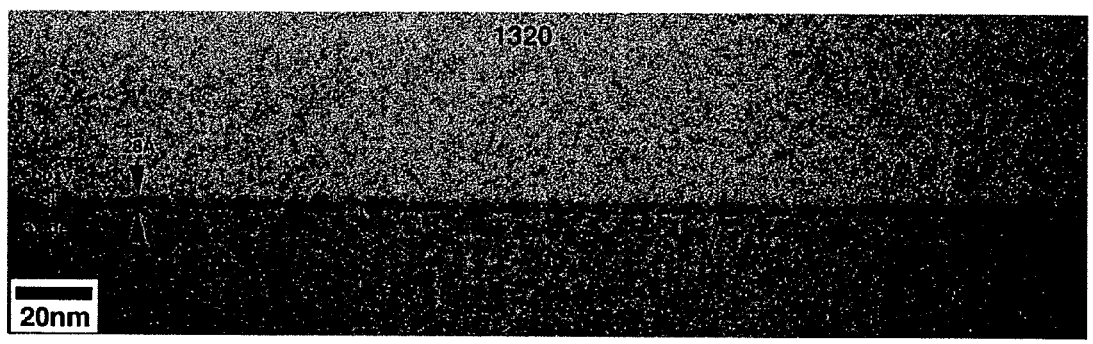
Figure 11:
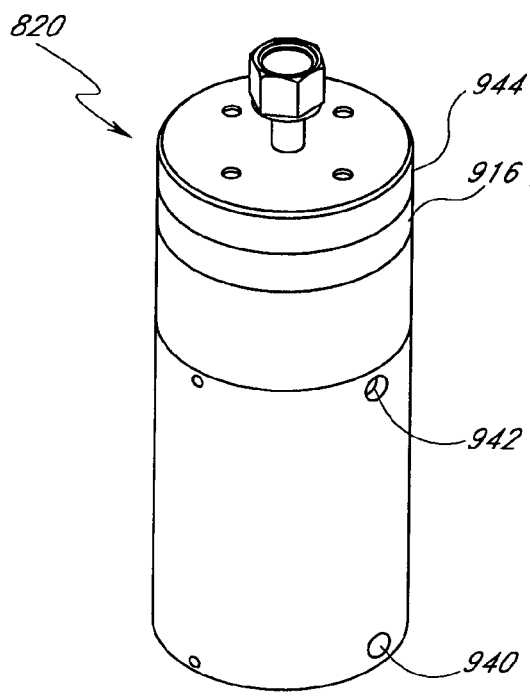

The process of Example 1 was repeated, except that the flow rate was 228 sccm, diborane was not used, and the deposition time was two minutes. A continuous amorphous silicon film having a total thickness of 28 Å and a surface roughness of about 2 Å rms (comparable to the underlying silicon dioxide) was deposited on the silicon dioxide layer at a deposition rate of 14 Å per minute. A layer of epoxy was then applied to facilitate cross-sectional sample preparation. FIG. 10 is reproduction of an electron micrograph showing a cross section of the resulting substrate showing the underlying SiO₂ layer ("oxide"), the deposited amorphous silicon film ("a-Si"), and the overlying epoxy layer ("epoxy").

Example 4

An eight-inch diameter (200 mm) <100> silicon wafer substrate having a 1,000 Å SiO₂ layer was placed into the reactor chamber and allowed to reach thermal equilibrium at 600° C. at 40 Torr pressure under a flow of 20 standard liters per minute (slm) of high purity hydrogen gas. Trisilane was introduced to the chamber by passing high purity hydrogen gas through liquid trisilane using a bubbler (maintained at room temperature using a water bath around the vessel containing the trisilane) connected by a feed line to the chamber. A flow rate of 180 standard cubic centimeters per minute (sccm) of the hydrogen/trisilane mixture, along with a flow of 90 sccm (inject) of diborane (100 ppm, 90 sccm mixed with 2 slm high purity hydrogen), was then passed into the reactor for 15 seconds to deposit an amorphous boron-doped silicon film having a thickness of 100 Å. Under these conditions, the delivery rate of trisilane to the substrate was about 0.1 gram per minute. The deposition rate was 400 Å per minute.

Example 5

An amorphous boron-doped silicon film was deposited as described in Example 4, except that deposition was carried out for 30 seconds to produce a film having a total thickness of 205 Å. The deposition rate was 410 Å per minute.

Example 6

An amorphous boron-doped silicon film was deposited as described in Example 4, except that deposition was carried out for one minute to produce a film having a total thickness of 409 Å. The deposition rate was 409 Å per minute.

Examples 4–6 demonstrate that deposition rates were essentially constant when trisilane was used to deposit thin films. The average deposition rate was 406 Å/minute and the variability was only 4.5 Å rms (1.1%).

Example 7 (Comparative)

An amorphous boron-doped silicon film was deposited as described in Example 4, except that silane was used instead of trisilane. Silane was supplied in the form of a gas at a flow rate of about 100 sccm. A bubbler was not used because silane is a gas under these conditions. The delivery rate of silane to the substrate was about 0.1 gram per minute, about the same as the delivery rate of trisilane in Examples 4–6.

Deposition was carried out for three minutes to produce a film having a total thickness of 16 Å. The deposition rate was 5.3 Å per minute.

Example 8 (Comparative)

An amorphous boron-doped silicon film was deposited as described in Example 7, except that deposition was carried out for five minutes to produce a film having a total thickness of 87 Å. The deposition rate was 17.4 Å per minute.

Example 9 (Comparative)

An amorphous boron-doped silicon film was deposited as described in Example 7, except that deposition was carried out for ten minutes to produce a film having a total thickness of 284 Å. The deposition rate was 28.4 Å per minute.

Examples 7–9 demonstrate that deposition rates varied significantly, depending on film thickness, when silane was used to deposit thin films. The deposition rate changed from 5.3 Å per minute to 28 Å per minute as the film thickness increased from 16 Å to 284 Å. The average was 17 Å/minute and the variability was 9.4 Å rms (55%).

Examples 4–9 demonstrate that the use of trisilane instead of silane allows for deposition to be conducted at much higher rates and with vastly improved film deposition uniformity.

Figure 8:
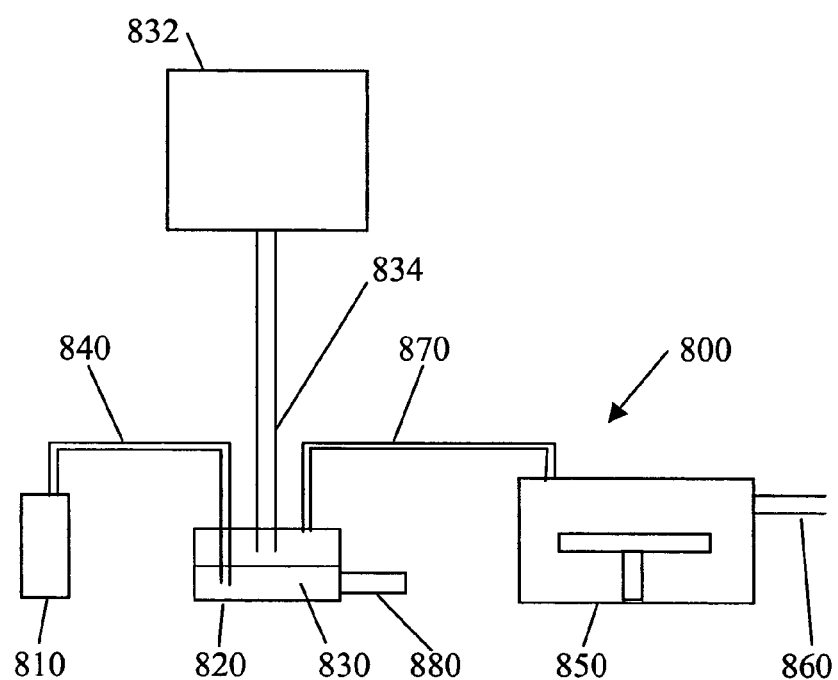
Figure 9:

An apparatus is provided for depositing a Si-containing material on a surface. A schematic diagram illustrating a preferred apparatus is shown in FIG. 8. This apparatus 800 comprises a carrier gas source 810, which contains, for example, hydrogen gas, a temperature controlled vaporization chamber that is illustrated as a bubbler 820 containing liquid trisilane 830, and a gas line 840 operatively connecting the gas source 810 to the bubbler 820. A storage container or source 832 of liquid trisilane supplies liquid trisilane to the bubbler 820 through a supply line 834. A CVD chamber 850, equipped with an exhaust line 860, is operatively connected to the bubbler 820 by a feed line 870. The flow of trisilane, entrained in the carrier gas, from the bubbler 820 to the CVD chamber 850, is preferably aided by a temperature regulation source 880 operatively disposed in proximity to the bubbler. The temperature regulation source 880 maintains the trisilane 830 at a temperature in the range of about 10° C. to about 70° C., preferably about 20° C. to about 52° C., to thereby control the vaporization rate of the trisilane. Preferably, the CVD chamber 850 is a single-wafer, horizontal gas flow reactor. Preferably, the apparatus is also comprised of a manifold (not shown) operatively connected to the feed line 870 to control the passage of the trisilane 830 from the bubbler 820 to the CVD chamber 850. Preferably, the gas line 870 is maintained at a temperature in the range of about 35° C. to about 70° C., preferably about 40° C. to about 52° C., to prevent condensation of the trisilane.

FIGS. 11–15 illustrate a preferred arrangement of the bubbler 820. As mentioned the above, the bubbler 820 contains liquid trisilane 830. Conventionally, bubblers have traditionally been made of stainless steel, including those used for more common liquid silicon precursor source such as dichlorosilane (DCS) and trichlorosilane (TCS). However, Applicants have discovered that such an arrangement decreases the shelf life of the trisilane because trisilane reacts with ferric materials. As such, in the preferred arrangement, the bubbler 820 includes a main body 900 that is made of a non-ferric material, preferably inert metal, and more preferably aluminum.

In the illustrated arrangement, the main body 900 comprises an inner surface 902, which defines a generally cylindrical cavity 904. See FIGS. 14 and 15. The illustrated inner surface 902 includes a generally vertical side wall 906 and a generally horizontal lower wall 908. The side wall 906 includes an upper, wider diameter portion 910, a lower, smaller diameter portion 912 and transition portion 914, which lies between the upper and lower portions 910, 912.

In the illustrated embodiment, the upper portion of the cavity 904 is closed by a transition member 915, which in the illustrated embodiment, is formed by a first member 916 and a second member 944. As will be explained in more detail below, the first member 916 is preferably made of the same material as the main body 900 (e.g., aluminum in the preferred embodiment) and thus can be directly welded or otherwise suitably attached to the main body 900. In contrast, the second member 944 is preferably made of a second material, e.g., stainless steel such that standard stainless steel support components can be welded directly to the second member 944.

Figure 14:
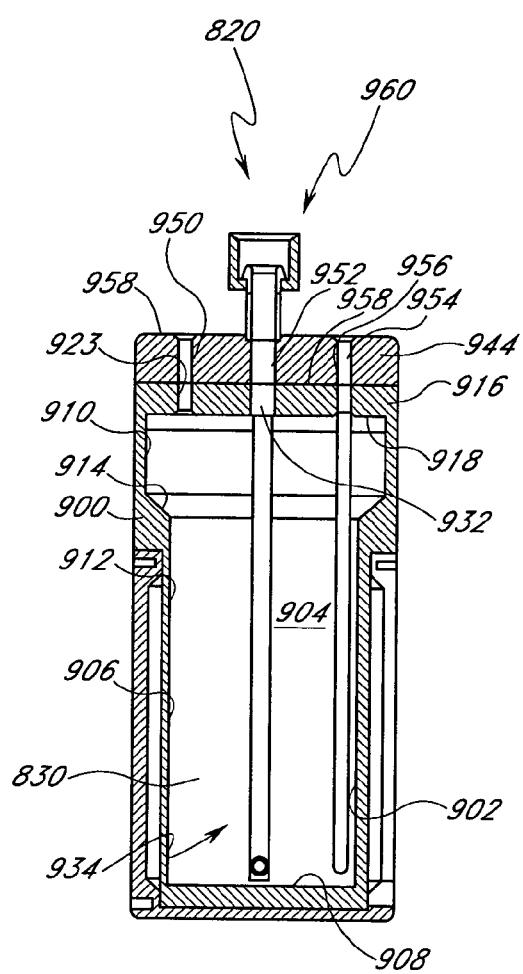
Figure 12:
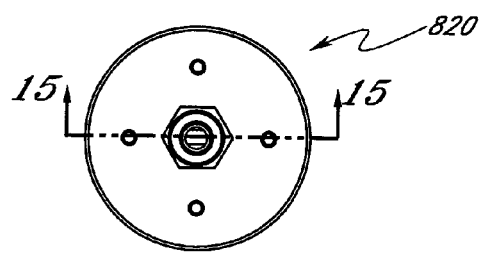
Figure 13:
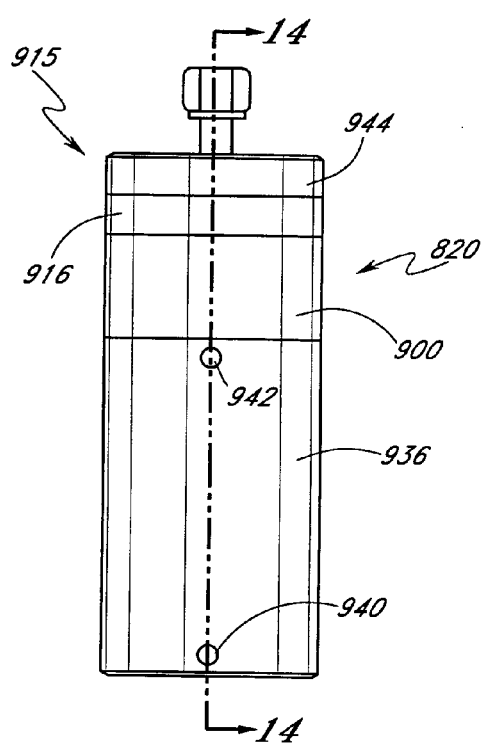
Figure 15:
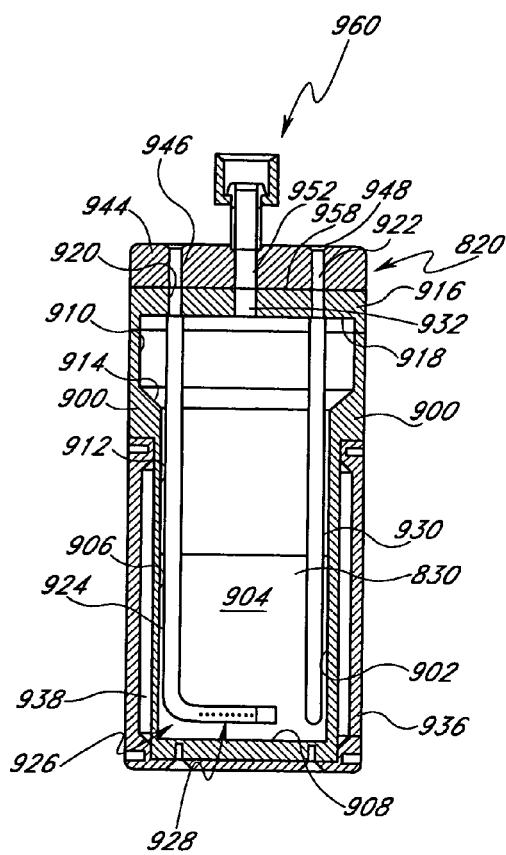

As best seen in FIG. 15, in the illustrated embodiment, the first member 916 defines an upper wall 918 of the cavity 904. The first member 916 comprises a carrier gas inlet 920, which is connected to the carrier gas line 840 (see FIG. 8), a source inlet 922, which is connected to the supply line 834 for delivering liquid trisilane from the storage container 832 (see FIG. 8) to the cavity 904, and a feed gas outlet 923 (see FIG. 14), which is connected to the feed line 870 (see FIG. 8). A first tubular member 924 extends from the carrier gas inlet 920 to the bottom of the cavity 904. In the illustrated arrangement, the first tubular member 924 includes a 90 degree bend 926 and has a lower portion 928 that extends parallel to the lower wall 908. Sparger holes are preferably provided on the lower portion 928. The bend 926 advantageously places the sparger holes near the center of the cavity 904. This allows the hydrogen to better mix with the liquid stored in the cavity and allows for better saturation of the liquid source material. The first tubular member 924 is preferably made of the same material as the main body 900 and thus can be welded to the first member 916 or otherwise suitably attached. A second tubular 930 extends from the source inlet 922. The second tubular member 930 also extends to the lower portions of the cavity 904 and is preferably made of the same material as the main body 902 and thus can be welded to the first member 916 or otherwise suitably attached.

As best seen in FIG. 14, the first member 916 preferably also includes a opening 932 for receiving a liquid level detection apparatus 934. In the preferred arrangement, the liquid level detection apparatus 934 is a capacitance level sensing device such as those known in the art. The capacitance level sensing device 934 comprises a capacitance probe, which is sensitive to the dielectric constants of liquid and gaseous trisilane. This capacitance difference may be measured and converted to a linear current signal that is proportional to the level of liquid trisilane in the bubbler 820. The liquid level sensing device 934 is in contact with the trisilane. As such, it is preferably made of the same material as the main body 900 or coated with a protective layer, such as PTFE (Teflon™).

Other types of liquid sensing devices may also be used, such as, for example, devices that use floats, reed switches, optical sensing, magnetostrictive sensors and/or acoustical sensing. However, the inventors have found that the capacitance level sensing device proves to be particularly advantageous for the illustrated bubbler 834. For example, the illustrated capacitance level sensing device 934 is reliable and provides high sensitivity, continuous analog input and smaller space requirements as compared to, for example, devices that use floats. In particular, floats have been found to be less reliable as compared to the capacitance level sensing device 934, have a hysterisis response, and do not continuously detect the liquid level when used in conjunction with typical reed switches. As such, a particular advantage to a capacitance sensor is the continuous level sensing. Continuous level sensing is preferred because it facilitates continued optimization of the "head space" required to fully saturate the source chemical.

In the illustrated embodiment, the main body is sounded by a jacket 936, which forms a space 938 for a cooling/heating liquid. See FIG. 15. The liquid is connected to the a temperature regulation source 880 (see FIG. 8) through an inlet 940 (FIG. 13) and an outlet 942 (FIG. 13) so that the liquid can be used to regulate the temperature of the bubbler 820. The jacket 936 is preferably anodized to reduce corrosion. In a modified arrangement, the bubbler 834, the CVD chamber 850 and the gas line 870 can be located with a common insulation chamber, which is kept at a target temperature to prevent condensation of the vaporized source material. In such an arrangement, the storage container or source 832 may be placed outside the common insulation chamber.

As mentioned above, in conventional substrate processing systems, the support components (e.g., the gas and feed lines) are made of stainless steel. The connectors associated with such components are also typically made of stainless steel and may use either silver-plated stainless steel gaskets or nickel gaskets. Such connectors cannot be welded to parts made of aluminum.

To solve this problem, the illustrated bubbler 820 includes the transition member 915, which serves as a transition between the aluminum body 900 and the stainless steel lines that are standard in the semiconductor industry. As explained above, the transition member 915 comprises a first member 916 and a second member 944. The first member 916 is preferably made of aluminum as is preferably directly welded to the body 900. The second member 944 is preferably made of the same material as the support components, e.g., stainless steel.

With reference to FIG. 15, the second member 944 includes a gas inlet 946, a liquid source inlet 948 and a gas outlet 950 (see FIG. 14), which are aligned with the gas inlet 920, source inlet 922 and the feed gas outlet 923 (see FIG. 14), respectively, of the first member 916. The second member 944 preferably also includes an opening 952 (see FIG. 14) for the liquid level sensing device 934. A thermal well 954 for receiving a thermal conductor (not shown) preferably also extends through the second member 944 and the first member 916. A temperature sensing device can be extend through the thermal well 954 to measure the temperature of the bubbler 820.

With continued reference to FIG. 14, the second member 944 includes a lower surface 956, which is adjacent to an upper surface 958 of the first member 916. In a preferred arrangement, the second member 944 is formed from 316 stainless steel and the lower surface 956 is preferably formed in the following manner: (i) the second member 944 is explosion bonded to a thin layer of 316 stainless steel that has been previously mechanically clad to a thin piece of 1100 aluminum, (ii) the thin piece of 1100 aluminum is explosion bonded to a thin piece of pure 1000 aluminum alloy and (iii) the thin piece of 1000 aluminum alloy is explosion bonded to the upper surface 958 of the first member 916, which is made of aluminum as described above. In this manner, the second member 944 can be bonded directly to the first member 916 to form a tight seal between the first member 916 and the second member 944.

Figure 16:
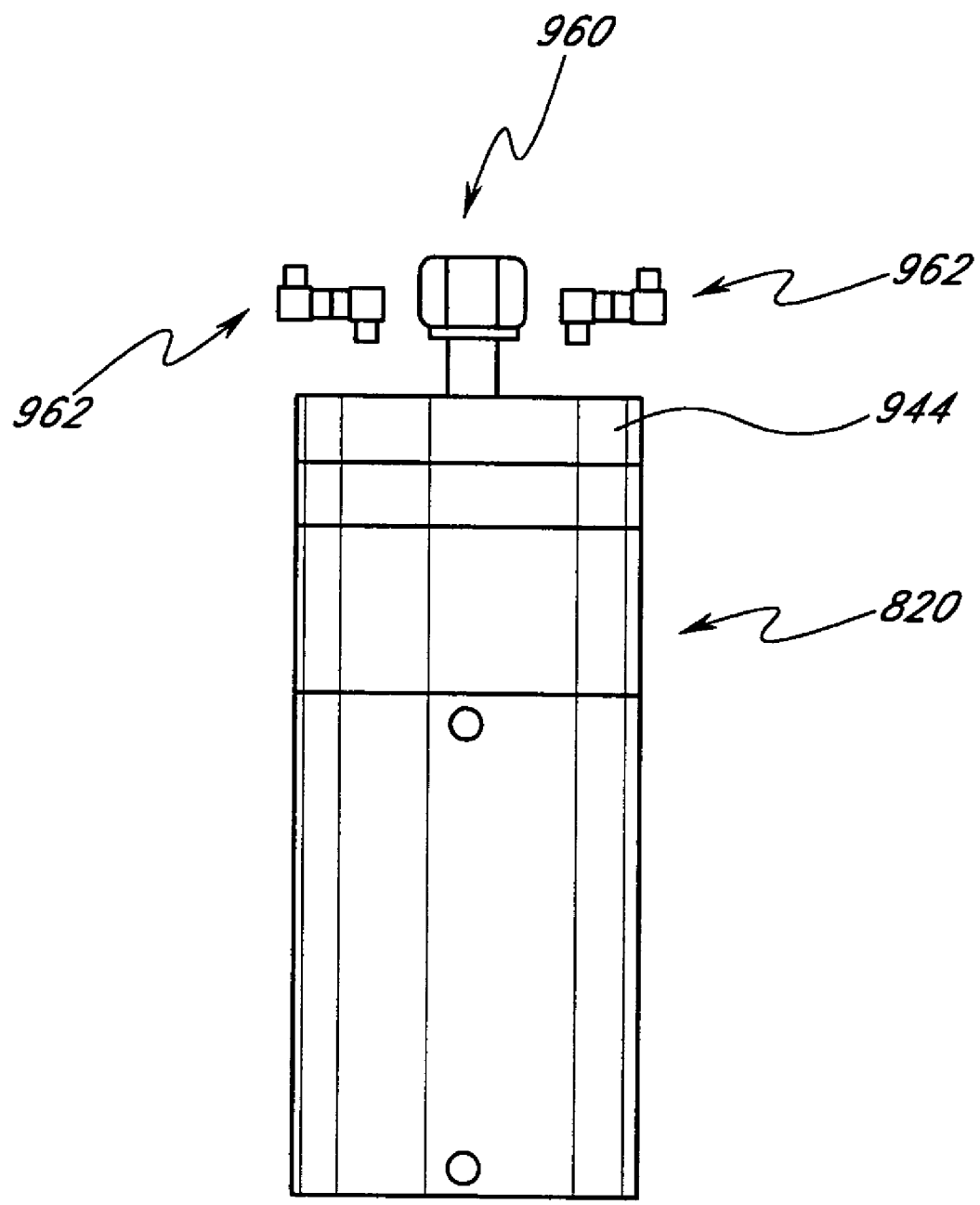

As mentioned above, the second member 944 preferably is made of the same material as the support components. As such, the connection pieces can be welded to a top surface 958 of the second member 944. For example, in the illustrated embodiment, a sensor transition piece 960 is welded to the second member 944. In a similar manner, connectors 962 such as the ones illustrated in FIG. 16 can be welded to the second member 944 to connect, for example, the, supply line 834, the gas line 840 and the feed line 870 to the liquid inlet 948, the gas inlet 946 and feed gas outlet 950, respectively. (see FIGS. 8 and 14)

The illustrated bubbler 820 has several advantages. For example, because the main body 900 is made of aluminum, the shelf life of the trisilane stored within the cavity 904 is increased. In addition, because the second member 944 is made of stainless steel, the support components 960, 962 may be welded to the bubbler to create a tight seal between the support components 960, 962 and the bubbler 820. In a similar manner, because the first member 916 is made of aluminum, it can be welded to the main body 900 to seal the cavity 904. The aluminum construction of the main body 900 also facilitates heating and cooling of the bubbler 820 because of the higher thermal conductivity of aluminum as compared to stainless steel.

It will be appreciated by those skilled in the art that various omissions, additions and variations may be made to the compositions and processes described above without departing from the scope of the invention, and all such modifications and changes are intended to fall within the scope of the invention, as defined by the appended claims.

We claim:

1. A substrate processing system for processing a substrate, comprising:
   a carrier gas source;
   a liquid source container;
   a reactor;
   a vaporization chamber comprising a body that forms a first inner surface that defines at least in part a cavity, the cavity being in communication with the carrier gas source through a gas line, the liquid source container through a supply line and the reactor through a feed line, the first inner surface being made from a first material that is non-ferric; and
   a transition piece having a first surface made from the first material and a second surface made from a second material that is ferric; wherein a connection between the vaporization chamber and at least one of the gas line, the supply line and the feed line extends from the first surface to the second surface and through the body of the vaporization chamber to the cavity, the connection including a connector that is attached to the second surface of the transition piece.

2. A substrate processing system as in claim 1, wherein the first material is aluminum.

3. A substrate processing system as in claim 2, wherein the second material is stainless steel.

4. A substrate processing system as in claim 1, wherein the liquid source container contains liquid trisilane.

5. A substrate processing system as in claim 4, wherein the carrier gas source contains hydrogen gas.

6. A substrate processing system as in claim 1, wherein the second material is stainless steel.

7. A substrate processing system as in claim 1, wherein the transition piece is welded to the body of the vaporization chamber.

8. A substrate processing system as in claim 1, wherein the vaporization chamber includes a liquid level sensing device.

9. A substrate processing system as in claim 8, wherein the liquid level sensing device is configured to sense the capacitance difference between a liquid source material and a vaporized source material.

10. A substrate processing system as in claim 9, wherein the liquid and vaporized source material is trisilane.

11. The substrate processing system as in claim 1, wherein the transition member comprises a first member and a second member, the first member being formed, at least in part, from the first material and the second member being formed, at least in part, from the second material.

12. The substrate processing system as in claim 11, wherein the second member comprises a first layer of the first material that has been explosion bonded to the second member, the first member being explosion bonded to the first layer of the second member.

13. The substrate processing system as in claim 12, wherein the first layer is mechanically cladded to a second layer of the second material, the second layer being explosion bonded to the second member.

14. The substrate processing system as in claim 1, wherein the vaporization chamber is a bubbler.

* * * * *